United States Patent
Cho et al.

(10) Patent No.: US 8,156,635 B2
(45) Date of Patent: Apr. 17, 2012

(54) CARRIER FOR MANUFACTURING A PRINTED CIRCUIT BOARD

(75) Inventors: Seong Min Cho, Gyunggi-do (KR); Keung Jin Sohn, Gyunggi-do (KR); Tae Kyun Bae, Gyunggi-do (KR); Hyun Jung Hong, Gyunggi-do (KR); Kyung Ah Lee, Seoul (KR); Chang Gun Oh, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 12/720,567

(22) Filed: Mar. 9, 2010

(65) Prior Publication Data
US 2011/0138621 A1     Jun. 16, 2011

(30) Foreign Application Priority Data
Dec. 15, 2009   (KR) .................. 10-2009-0124708

(51) Int. Cl.
*B23P 19/00*     (2006.01)
(52) U.S. Cl. ........... 29/729; 29/825; 29/830; 228/179.1; 228/180.1
(58) Field of Classification Search .................. 29/825, 29/830, 846, 729; 228/179.1, 180.1
See application file for complete search history.

(56) References Cited

U.S. PATENT DOCUMENTS

| | | | | |
|---|---|---|---|---|
| 5,221,859 | A * | 6/1993 | Kobayashi et al. | 257/676 |
| 6,334,567 | B1 * | 1/2002 | Xie et al. | 228/110.1 |
| 7,669,320 | B2 * | 3/2010 | Hurwitz et al. | 29/846 |
| 2007/0289128 | A1 | 12/2007 | Takano et al. | |
| 2008/0136019 | A1 * | 6/2008 | Johnson et al. | 257/737 |

OTHER PUBLICATIONS

Office Action from counterpart Korean Patent Application No. 10-2009-124708, mailed May 20, 2011, 3 pages.

* cited by examiner

*Primary Examiner* — Carl Arbes
(74) *Attorney, Agent, or Firm* — Blakely Sokoloff Taylor & Zafman LLP

(57) ABSTRACT

Disclosed herein is a carrier for manufacturing a substrate, including: an insulation layer including a first metal layer formed on one side or both sides thereof; a second metal layer formed on one side of the first metal layer; and a third metal layer formed on one side of the second metal layer, wherein the second metal layer has a lower melting point than the first metal layer or the third metal layer. The carrier is advantageous in that a build up layer can be separated from a carrier by heating, so that a routing process is not required, with the result that the size of a substrate does not change when the build up layer is separated from the carrier, thereby reusing the carrier and maintaining the compatibility between the substrate and manufacturing facilities.

7 Claims, 7 Drawing Sheets

CARRIER FOR MANUFACTURING A PRINTED CIRCUIT BOARD

CROSS REFERENCE TO RELATED APPLICATION

This application claims the benefit of Korean Patent Application No. 10-2009-0124708, filed Dec. 15, 2009, entitled "A carrier member for manufacturing a substrate and a method of manufacturing a substrate using the same", which is hereby incorporated by reference in its entirety into this application.

BACKGROUND OF THE INVENTION

1. Technical Field

The present invention relates to a carrier for manufacturing a substrate and a method of manufacturing a substrate using the same.

2. Description of the Related Art

Generally, printed circuit boards (PCBs) are manufactured by patterning one or both sides of a substrate, composed of various thermosetting resins, using copper foil, and disposing and fixing ICs or electronic parts on the substrate to form an electric circuit and then coating the substrate with an insulator.

Recently, with the advancement of the electronics industry, electronic parts are increasingly required to be highly functionalized, light, thin, short and small. Thus, printed circuit boards loaded with such electronic parts are also required to be highly densified and thin.

In particular, in order to keep up with the thinning of printed circuit boards, a coreless substrate which can decrease thickness by removing a core and can shorten signal processing time is attracting considerable attention. However, a coreless substrate needs a carrier serving as a support during a process because it does not have a core. Hereinafter, a conventional method of manufacturing a coreless substrate will be described with reference to FIGS. 1A to 1E.

FIGS. 1A to 1E are sectional views sequentially showing a conventional method of manufacturing a substrate using a carrier. Problems of conventional technologies will be described with reference to FIGS. 1A to 1E.

First, as shown in FIG. 1A, a carrier 10 is provided. The carrier 10 is fabricated by sequentially forming adhesive films 12, first metal layers 13 and second metal layers 14 on both sides of a copper clad laminate (CCL) 11. In this case, the carrier is heated and pressed by a press, and thus the copper clad laminate 11 and the second metal layer 14 attach to each other at a periphery thereof by means of the adhesive film 12. Meanwhile, in order to stably attach the copper clad laminate 11 and the second metal layer 14 to each other, the contact face therebetween must have a width of 10 mm, and the first metal layer 13 and the second metal layer are vacuum-adsorbed.

Subsequently, as shown in FIG. 1B, build up layers 15 are formed on both sides of the carrier 10. Here, each of the build up layers 15 is formed in a general manner, and is additionally provided with a third metal layer 16 for preventing the warpage of the build up layer 15 at the outermost layer thereof.

Subsequently, as shown in FIG. 1C, the build up layers 15 are separated from the carrier 10. Here, the build up layers 15 are separated from the carrier 10 by removing the edge of the adhesive film through which the copper clad laminate 11 and the second metal layer 14 are attached to each other by a routing process.

Subsequently, as shown in FIG. 1D, the second metal layer 14 and the third metal layer 15 formed at the outermost layers of the build up layer 15 are removed by etching.

Subsequently, as shown in FIG. 1E, openings 17 for exposing pads 19 are formed in the outermost insulation layers of the build up layer 15, and then solder balls 18 are formed on the pads 19.

In this conventional substrate manufacturing method, the build up layer 15 must be finally separated from the carrier 10. However, since both edges of the carrier 10 are removed through a routing process during this separation procedure, the size of the carrier 10 is decreased, and thus it is difficult to reuse the carrier 10. Therefore, the conventional substrate manufacturing method is problematic in that the carrier 10 must be additionally provided whenever a printed circuit board is manufactured, thus increasing the production cost of the printed circuit board. Further, the conventional substrate manufacturing method is problematic in that it is difficult to maintain the compatibility between a substrate and a manufacturing facility because the size of the substrate is changed by a routing process.

Furthermore, the conventional substrate manufacturing method is problematic in that the build up layer 15 can be arbitrarily separated from the carrier 10 because the build up layer 15 is actually fixed on the carrier 10 by only the adhesion force of the edge of the adhesive film 12.

SUMMARY OF THE INVENTION

Accordingly, the present invention has been made to solve the above-mentioned problems, and the present invention provides a carrier for manufacturing a substrate, from which a build up layer can be easily separated by heating a metal layer having a relatively low melting point without performing a routing process, and a method of manufacturing a substrate using the same.

An aspect of the present invention provides a carrier for manufacturing a substrate, including: an insulation layer including a first metal layer formed on one side or both sides thereof; a second metal layer formed on one side of the first metal layer; and a third metal layer formed on one side of the second metal layer, wherein the second metal layer has a lower melting point than the first metal layer or the third metal layer.

Here, the second metal layer may be made of tin or a tin alloy.

Further, the second metal layer may be made of any one selected from the group consisting of tin, cadmium, lead, bismuth, zinc, and alloys or combinations thereof.

Further, the first metal layer or the third metal layer may be made of copper, nickel or aluminum.

Further, the insulation layer including the first metal layer may be a copper clad laminate (CCL).

Further, an intermetallic compound layer may be formed between the first metal layer and the second metal layer or between the second metal layer and the third metal layer.

Another aspect of the present invention provides a method of manufacturing a substrate using a carrier, including: providing an insulation layer including a first metal layer formed on one side or both sides thereof; forming a second metal layer having a lower melting point than the first metal layer on one side of the first metal layer and then forming a third metal layer having a higher melting point than the second metal layer on one side of the second metal layer to provide a carrier; forming a build up layer on one side of the third metal layer; and heating the second metal layer to its melting point or higher to separate the build up layer from the carrier.

Here, in the forming of the second metal layer and the third metal layer, the second metal layer may be made of tin or a tin alloy.

Further, in the forming of the second metal layer and the third metal layer, the second metal layer may be made of any one selected from the group consisting of tin, cadmium, lead, bismuth, zinc, and alloys or combinations thereof.

Further, the method of manufacturing a substrate using a carrier may further include: removing the second metal layer remaining on the third metal layer after the separating of the build up layer from the carrier.

Further, the method of manufacturing a substrate using a carrier may further include: removing the third metal layer after the separating of the build up layer from the carrier.

Further, in the forming of the second metal layer and the third metal layer, the second metal layer may be formed on one side of the first metal layer through a plating process.

Further, in the forming of the second metal layer and the third metal layer, the second metal layer may be formed on one side of the first metal layer by attaching metal foil onto the first metal layer through heating and pressing processes.

Further, in the forming of the second metal layer and the third metal layer, the third metal layer may be formed on one side of the second metal layer through a plating process.

Further, in the forming of the second metal layer and the third metal layer, the third metal layer is formed on one side of the second metal layer by attaching metal foil onto the second metal layer through heating and pressing processes.

Further, in the providing of the insulation layer including the first metal layer, the first metal layer may be made of copper, nickel or aluminum.

Further, in the forming of the second metal layer and the third metal layer, the third metal layer may be made of copper, nickel or aluminum.

Further, in the providing of the insulation layer including the first metal layer, the insulation layer including the first metal layer may be a copper clad laminate (CCL).

Further, in the forming of the second metal layer and the third metal layer, an intermetallic compound layer may be formed between the first metal layer and the second metal layer or between the second metal layer and the third metal layer.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
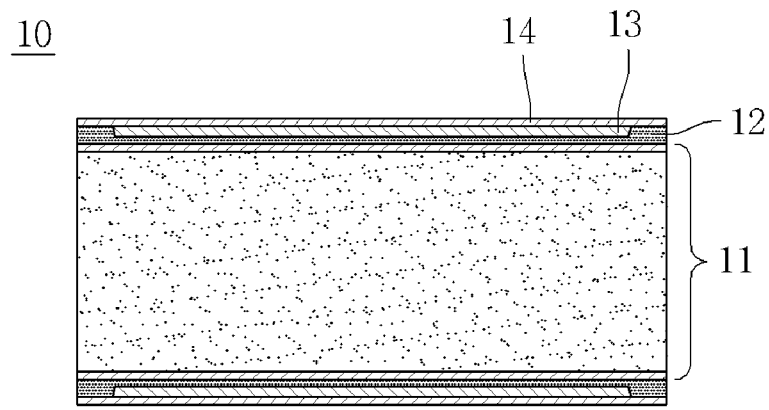
FIGS. 1A to 1E are sectional views sequentially showing a conventional method of manufacturing a substrate using a carrier.
Figure 1B:
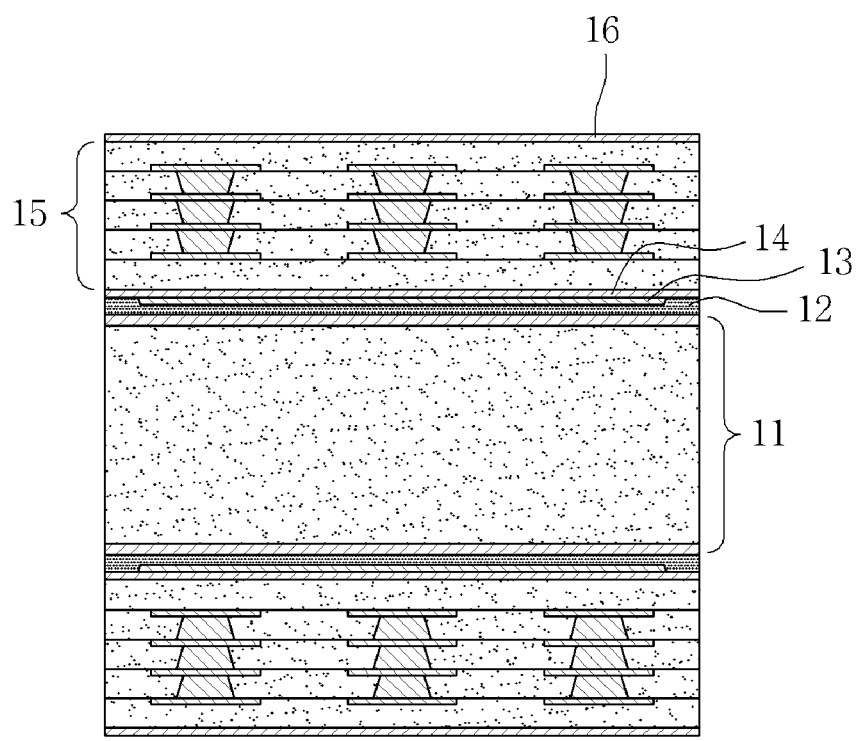
Figure 1C:
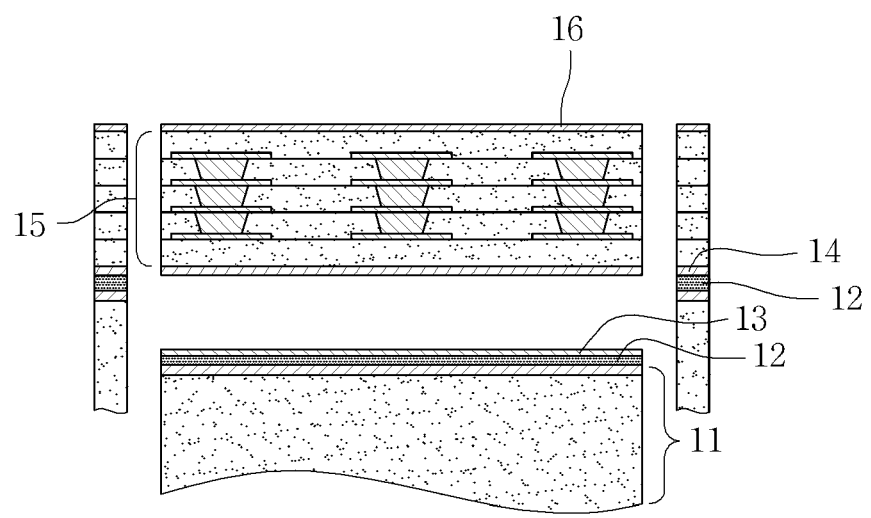
Figure 1D:
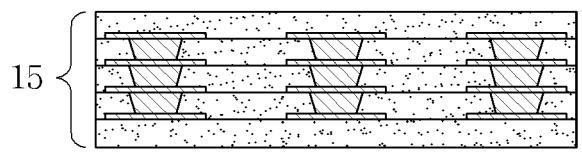
Figure 1E:
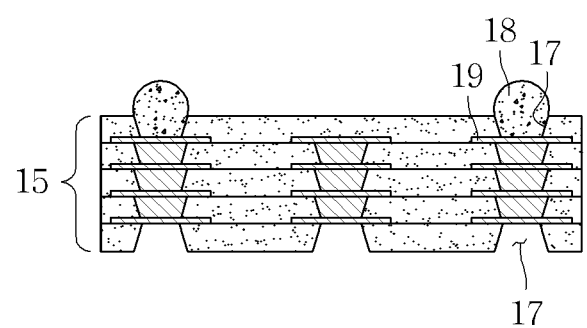

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. Further, in the following description, the terms "one side", "the other side", "first", "second", "third" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
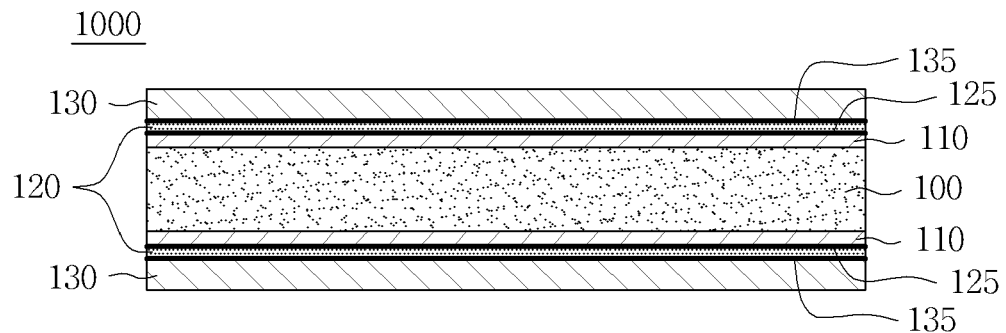
FIG. 2 is a sectional view showing a carrier for manufacturing a substrate according to an embodiment of the present invention.

FIG. 2 is a sectional view showing a carrier for manufacturing a substrate according to an embodiment of the present invention.

As shown FIG. 2, a carrier 1000 for manufacturing a substrate according to an embodiment of the present invention includes an insulation layer 100 provided with first metal layers 110 on one side or both sides thereof, a second metal layer 120 formed on one side of each of the first metal layers 110, and a third metal layer 130 formed on one side of the second metal layer 120, wherein the second metal layer 120 has a lower melting point than the first metal layer 110 or the third metal layer 130.

The insulation layer 100 is a base member constituting the carrier 1000, and is provided with the first metal layers 110 on one side or both sides thereof. The insulation layer 100 is not particularly limited, but the insulation layer 100 provided with the first metal layers 110 on one side or both sides thereof may be a single-sided copper clad laminate (CCL) or a double-sided copper clad laminate (CCL). In addition to this, prepreg or ajinomoto build up film (ABF), which is a commonly-used insulating material, may be employed as the insulation layer 100. Further, the insulation layer 100 may further include paper, glass fiber, non-woven glass fabric or the like as a reinforcing material in order to improve the mechanical strength of the carrier 1000.

Since the first metal layer 110 serves as a support of the carrier 1000, the first metal layer 110 must have a bearing resistance of predetermined strength or more in order to prevent the warpage of the carrier 1000 and must have a higher melting point than the second metal layer 120 which is melted when a build up layer 140 is separated from the carrier 1000. Considering the above bearing resistance and melting point, the first metal layer 110 may be made of copper, nickel or aluminum. However, when a copper clad laminate (CCL) is used as the insulation layer, it goes without saying that the first metal layer 110 is made of copper.

Meanwhile, in FIG. 2, the first metal layers 110 are formed on both sides of the insulation layer 100, but the present invention is not limited thereto. The first metal layer 110 may be selectively formed on only one side of the insulation layer 100. That is, when build up layers 140 are formed on both sides of the carrier 1000 (refer to FIG. 8), the first metal layers 110 may be formed on both sides of the insulation layer 100, and, when the build up layer 140 is formed on only one side of the carrier 1000, the first metal layer 110 may be formed on only one side of the insulation layer 100.

The second metal layer 120 serves to entirely maintain the conjunction between the carrier 1000 and the build up layer 140 by attaching the first metal layer 110 and the third metal layer 130 to each other. Here, the second metal layer 120 may be made of tin or a tin alloy, or may be made of any one selected from the group consisting of tin, cadmium, lead, bismuth, zinc, and alloys or combinations thereof. Further, the second metal layer 120 may be formed on the first metal layer 110 through a plating process, or may be formed on the first metal layer 110 by attaching metal foil onto the first metal layer 110 through heating and pressing processes. In this case, the second metal layer 120 reacts with the first metal layer 110 to form an intermetallic compound layer 125. For example, when the first metal layer 110 is made of copper and the second metal layer 120 is made of tin, an intermetallic compound layer 125, such as $Cu_6Sn_5$, $Cu_3Sn$ or the like, is formed between the first metal layer 110 and the second metal layer 120. However, in order to separate the build up layer 140 from the carrier 1000, the second metal layer 120 must not be entirely converted into the intermetallic compound layer 125, and a pure second metal layer having a constant melting point must remain. Finally, the second metal layer 120 is heated to the melting point or higher and thus melted to separate the build up layer 140 from the carrier 1000 (refer to FIG. 9). For reference, tin, cadmium, lead, bismuth, zinc or the like, constituting the second metal layer 120, has a melting point ranging from about 232° C. to about 419° C. (tin: about 232° C., cadmium: about 320.9° C., lead: about 327° C., bismuth: about 271.3° C., zinc: about 419° C.), whereas copper, nickel or aluminum, constituting the first metal layer 110, has a melting point ranging from about 660° C. to about 1455° C. (copper: about 1083° C., nickel: about 1455° C., aluminum: about 660° C.). Therefore, the first metal layer 110, the second metal layer 120 and the third metal layer 130 are heated to a predetermined temperature (for example, a temperature ranging from 232° C. or more to less than 1083° C. when the second metal layer 120 is made of tin and each of the first metal layer 110 and the third metal layer 130 is made of copper), so that only the second metal layer 120 is selectively melted without phase-changing the first metal layer 110 and the third metal layer 130, thereby separating the build up layer 140 from the carrier 1000.

Since the third metal layer 130, similarly to the above-mentioned first metal layer 110, serves as a support of the carrier 1000, the third metal layer 130 must have bearing resistance of predetermined strength or more in order to prevent the warpage of the carrier 1000 and must have a higher melting point than the second metal layer 120 which is melted when the build up layer 140 is separated from the carrier 1000. Further, the third metal layer 130 may be made of a material which can be easily etched because it must be removed finally. Considering the above bearing resistance, melting point and etchability, the third metal layer 130 may be made of copper, nickel or aluminum. Further, the third metal layer 130 may be formed on the second metal layer 120 through a plating process, or may be formed on the second metal layer 120 by attaching metal foil onto the second metal layer 120 through heating and pressing processes. In this case, as described above, the third metal layer 130 reacts with the second metal layer 120 to form an intermetallic compound layer 135.

Figure 9:
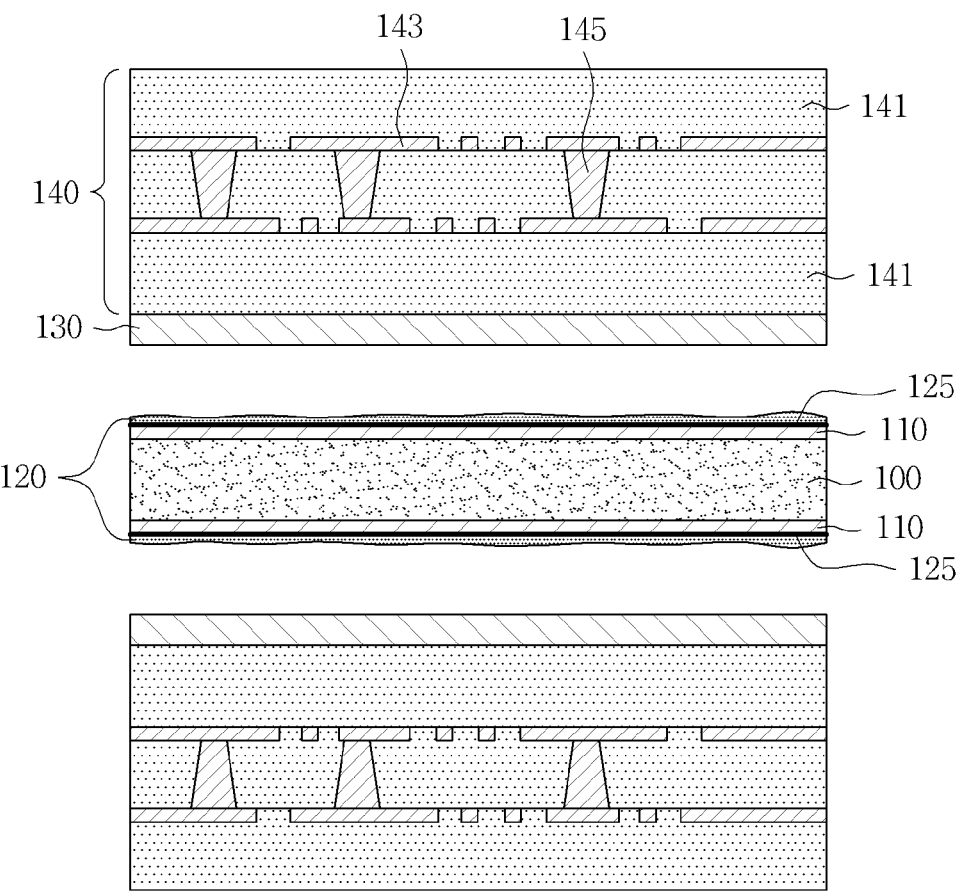

The carrier 1000 according to this embodiment is heated to a predetermined temperature (a melting point of the second metal layer 120) or higher to separate the build up layer 140 therefrom (refer to FIG. 9). Therefore, the present invention, differently from conventional technologies, is advantageous in that a routing process can be omitted, and in that the conjunction of the carrier 1000 and the build up layer 140 can be stably maintained at about 200° C. generally reached during a process of manufacturing a substrate.

FIGS. 3 to 12 are sectional views sequentially showing a method of manufacturing a substrate using the carrier according to an embodiment of the present invention.

As shown in FIGS. 3 to 12, a method of manufacturing a substrate using the carrier according to an embodiment of the present invention includes: providing an insulation layer 100 including first metal layers 110 formed on one side or both sides thereof; forming a second metal layer 120 having a lower melting point than the first metal layer 110 on one side of each of the first metal layers 110 and then forming a third metal layer 130 having a higher melting point than the second metal layer 120 on one side of the second metal layer 120 to provide a carrier 1000; forming a build up layer 140 on one side of the third metal layer 130; and heating the second metal layer 120 to its melting point or higher to separate the build up layer 140 from the carrier 1000.

Figure 3:
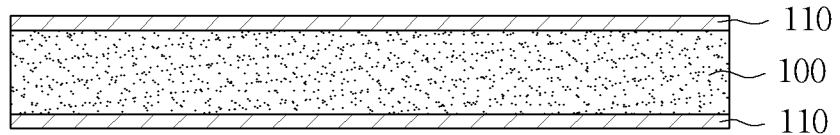
FIGS. 3 to 12 are sectional views sequentially showing a method of manufacturing a substrate using the carrier according to an embodiment of the present invention.

First, as shown in FIG. 3, an insulation layer 100 including first metal layers 110 formed on both sides thereof is provided. Here, a copper clad laminate (CCL) may be used as the insulation layer 100, and, in this case, the first metal layers 110 formed on both sides of the insulation layer 100 may be copper foil. However, the insulation layer 100 is not limited to the copper clad laminate (CCL), and prepreg or ajinomoto build up film (ABF), which is a commonly-used insulating material, may be employed as the insulation layer 100. In this case, the first metal layers may be made of copper, nickel or aluminum. Meanwhile, in FIG. 3, although the first metal layers 110 are formed on both sides of the insulation layer 100, the first metal layer 110 may be selectively formed on only one side of the insulation layer 100, thus selectively forming the build up layer 140 on only one side of the carrier 1000 during a subsequent process.

Figure 4:
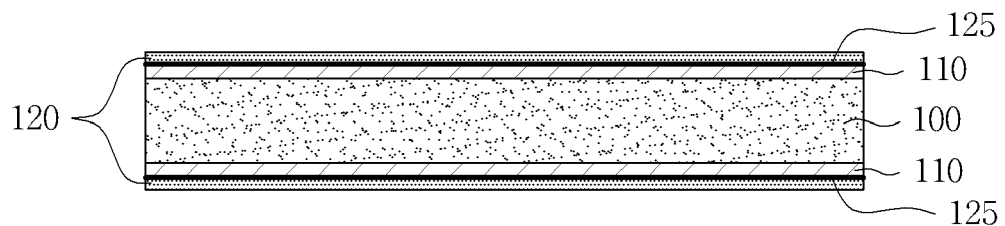

Subsequently, as shown in FIG. 4, a second metal layer 120 is formed on one side of each of the first metal layers 110. Here, the second metal layer 120 may be formed on the first metal layer 110 through a plating process, or may be formed on the first metal layer 110 by attaching metal foil onto the first metal layer 110 through heating and pressing processes.

Meanwhile, the second metal layer 120 reacts with the first metal layer 110 to form an intermetallic compound layer 125 between the first metal layer 110 and the second metal layer 120. Further, since the second metal layer 120 must serve to separate the build up layer 140 from the carrier 1000 by melting it in a subsequent process, the second metal layer 120 must have a lower melting point than the first metal layer 110 or third metal layer 130 made of copper, nickel or aluminum or the like. Considering this point, the second metal layer 120 may be made of tin or a tin alloy, or may be made of any one selected from the group consisting of tin, cadmium, lead, bismuth, zinc, and alloys or combinations thereof.

Figure 5:
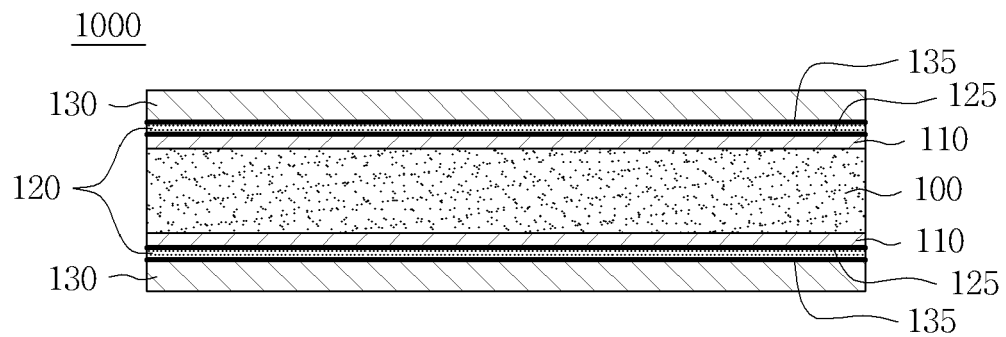

Subsequently, as shown in FIG. 5, a third metal layer 130 is formed on the second metal layer 120 to provide a carrier 1000. Here, the third metal layer 130, similarly to the method of forming the second metal layer 120, may be formed on the second metal layer 120 through a plating process, or may be formed on the second metal layer 120 by attaching metal foil onto the second metal layer 120 through heating and pressing processes. In this case, the third metal layer 130 reacts with the second metal layer 120 to form an intermetallic compound layer 135 between the second metal layer 120 and the third metal layer 130.

Meanwhile, since the third metal layer 130 must have a higher melting point than the second metal layer 120 made of tin, cadmium, lead, bismuth, zinc or the like and must be removed in a subsequent process, the third metal layer 130 may be made of a material which can be easily etched. Considering this point, the third metal layer 130 may be made of copper, nickel or aluminum.

Figure 6:
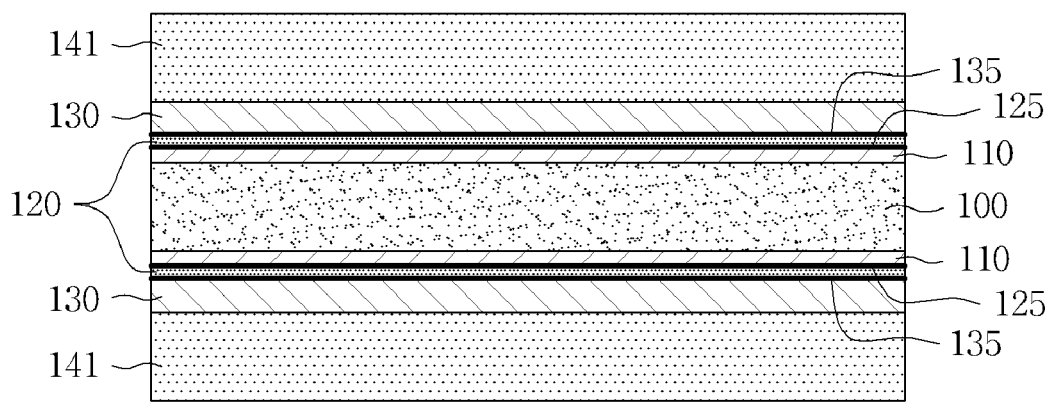
Figure 7:
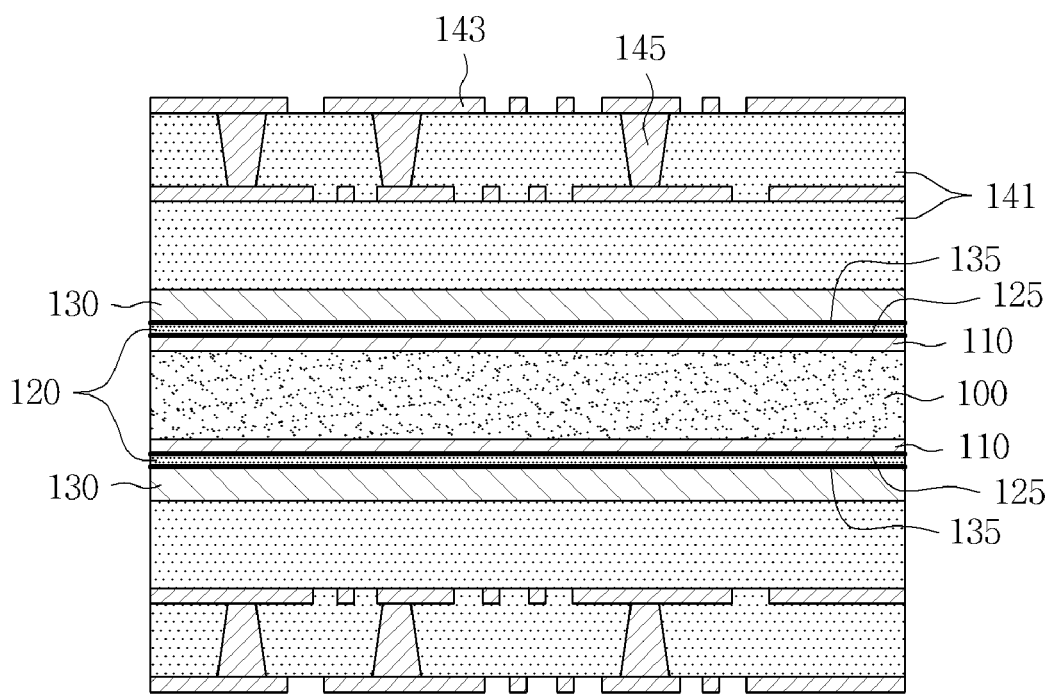
Figure 8:
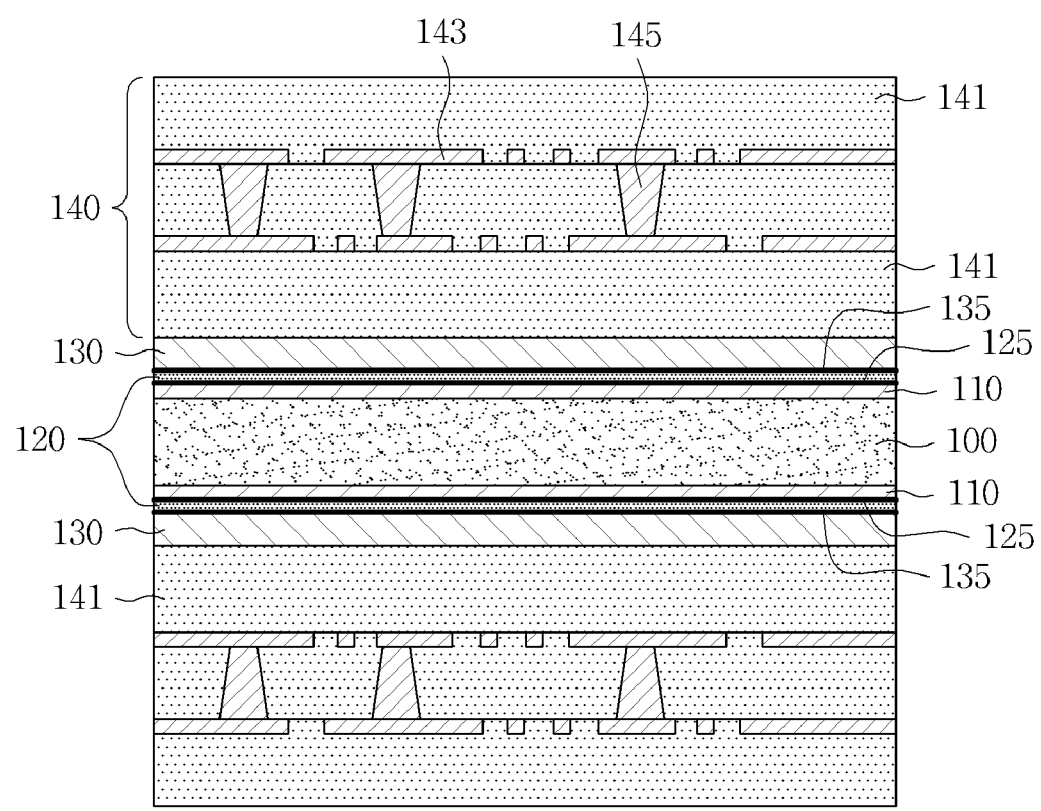

Subsequently, as shown in FIGS. 6 to 8, a build up layer 140 is formed on one side of the third metal layer 130. Here, the build up layer 140 can be completed by applying an insulating material 141 onto the third metal layer 130, forming viaholes in the insulating material 141 using an YAG or $CO_2$ laser and then forming a circuit layer 143 including vias 145 on the insulating material 141 through a Semi-Additive Process (SAP) or a Modified Semi-Additive Process (MSAP).

Figure 10:
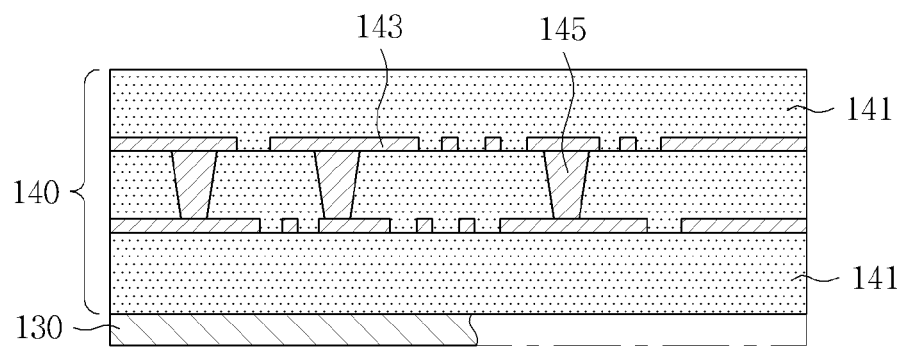
Figure 11:
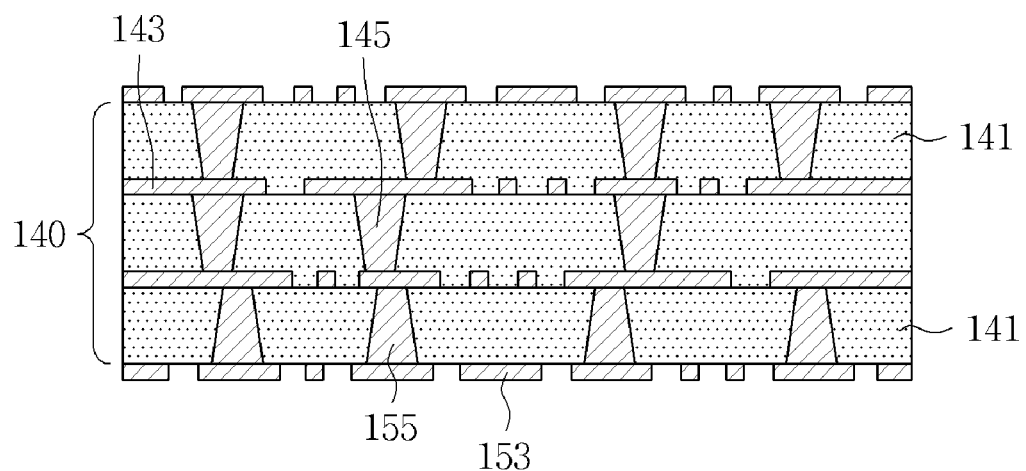

Meanwhile, referring to FIGS. 6 to 11, it is shown in FIG. 11 that a circuit layer 153 including vias 155 is formed on the outermost insulating material 141 after the build up layer 140 is separated from the carrier 100 although the circuit layer 153 including vias 155 is not formed on the outermost insulating material 141 in this process, but the scope of the present invention is not limited thereto. For example, in this process, circuit layers 143 and 153 including vias 145 and 155 may be sequentially formed on their respective insulating materials 141 while sequentially forming the insulating materials 141.

Subsequently, as shown in FIG. 9, the second metal layer 120 is heated to its melting point or higher to separate the build up layer 140 form the carrier 1000. As described the second metal layer 120 has a melting point ranging from about 232° C. to about 419° C., whereas the first metal layer 110 or the third metal layer 130 has a melting point ranging from about 660° C. to about 1455° C. Therefore, the first metal layer 110, the second metal layer 120 and the third metal layer 130 are heated to a predetermined temperature (for example, a temperature ranging from 232° C. or more to less than 1083° C. when the second metal layer 120 is made of tin and each of the first metal layer 110 and the third metal layer 130 is made of copper), thus separating the build up layer 140 from the carrier 1000. In this case, physical force may be additionally applied thereto in order to more efficiently separate the build up layer 140 from the carrier 1000.

Meanwhile, after the build up layer 140 is separated from the carrier 1000, a molten second metal layer 120 can remain on the third metal layer 130. The molten second metal layer 120 remaining on the third metal layer 130 may be removed by an etching process.

Subsequently, as shown in FIG. 10, the third metal layer 130 is removed from the build up layer 140. Although methods of removing the third metal layer 130 are not particularly limited, the third metal layer 130, similarly to the molten second metal layer 120 remaining on the third metal layer 130, may also be removed by an etching process. Further, a manufacturing process can be simplified by simultaneously removing the third metal layer 130 when the molten second metal layer 120 remaining on the third metal layer 130 is removed by an etching process.

Subsequently, as shown in FIG. 11, a circuit layer 153 including vias 155 is formed on the outermost insulating material 141 of the build up layer 141. Since the third metal layer 130 is removed from the build up layer 140 in the previous process, the outermost insulating material 141 of the build up layer 140 is exposed. Therefore, the circuit layer 153 including vias 155 may be formed by forming viaholes in the exposed outermost insulating material 141 using an YAG or $CO_2$ laser and then performing a Semi-Additive Process (SAP) or a Modified Semi-Additive Process (MSAP). However, as described above, when the circuit layers 143 and 153 including vias 145 and 155 are sequentially formed on their respective insulating materials 141 while sequentially forming the insulating materials 141 in the process of forming the build up layer 140, this process may be omitted.

Figure 12:
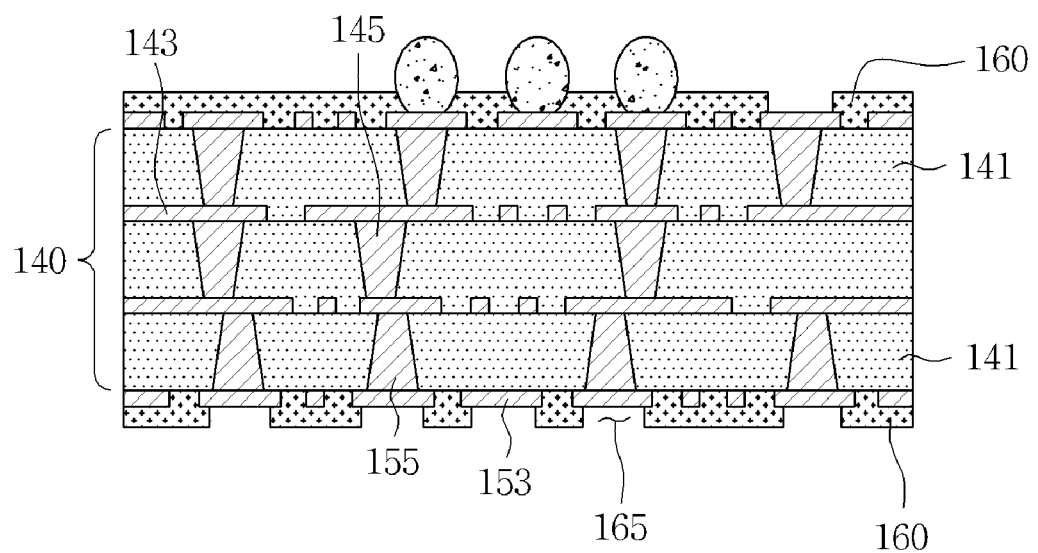

Subsequently, as shown in FIG. 12, a solder resist layer 160 is formed on the outermost insulating material of the build up layer 140. Here, the solder resist layer 160 is made of a heat-resistant coating material, and serves to protect the circuit layer 153 such that solder is not applied onto the circuit layer 153 during soldering. Further, in order to electrically connect the circuit layer 153 with external circuits, openings 165 may be formed in the solder resist layer 160 to expose pads.

As described above, according to the present invention, a build up layer can be separated from a carrier by heating, so that a routing process is not required, with the result that the size of a substrate does not change when the build up layer is separated from the carrier, thereby reusing the carrier and maintaining the compatibility between the substrate and manufacturing facilities.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A carrier for manufacturing a printed circuit board, comprising:
    an insulation layer including a first metal layer formed on one side or both sides thereof;
    a second metal layer formed on one side of the first metal layer; and
    a third metal layer formed on one side of the second metal layer,
    wherein the second metal layer has a lower melting point than the first metal layer or the third metal layer so that only the second metal layer is selectively melted without phase-changing the first metal layer and the third metal layer when the second metal layer is heated to the melting point or higher.

2. The carrier for manufacturing a printed circuit board according to claim 1, wherein the second metal layer is made of tin or a tin alloy.

3. The carrier for manufacturing a printed circuit board according to claim 1, wherein the second metal layer is made of any one selected from the group consisting of tin, cadmium, lead, bismuth, zinc, and alloys or combinations thereof.

4. The carrier for manufacturing a printed circuit board according to claim 1, wherein the first metal layer or the third metal layer is made of copper, nickel or aluminum.

5. The carrier for manufacturing a printed circuit board according to claim 1, wherein the insulation layer including the first metal layer is a copper clad laminate (CCL).

6. The carrier for manufacturing a printed circuit board according to claim 1, wherein an intermetallic compound layer is formed between the first metal layer and the second metal layer or between the second metal layer and the third metal layer.

7. The carrier for manufacturing a printed circuit board according to claim 1, wherein the first and third metal layers serve as a support of the carrier.

* * * * *